(12) United States Patent
Alkhawaldeh et al.

(10) Patent No.: US 7,998,271 B2
(45) Date of Patent: Aug. 16, 2011

(54) SOLVENTS AND NEW METHOD FOR THE SYNTHESIS OF CDSE SEMICONDUCTOR NANOCRYSTALS

(75) Inventors: Ammar S. Alkhawaldeh, Hillsboro, OR (US); Matteo Pasquali, Houston, TX (US); Michael S. Wong, Houston, TX (US)

(73) Assignee: William Marsh Rice Universtiy, Houston, TX (US)

( * ) Notice: Subject to any disclaimer, the term of this patent is extended or adjusted under 35 U.S.C. 154(b) by 1149 days.

(21) Appl. No.: 10/595,817

(22) PCT Filed: Nov. 19, 2004

(86) PCT No.: PCT/US2004/038807
§ 371 (c)(1),
(2), (4) Date: Apr. 23, 2007

(87) PCT Pub. No.: WO2005/052996
PCT Pub. Date: Jun. 9, 2005

(65) Prior Publication Data
US 2007/0204790 A1  Sep. 6, 2007

Related U.S. Application Data

(60) Provisional application No. 60/523,235, filed on Nov. 19, 2003.

(51) Int. Cl.
*C30B 7/00* (2006.01)
(52) U.S. Cl. ................. 117/68; 117/69; 117/70
(58) Field of Classification Search .............. 117/68, 117/69, 70
See application file for complete search history.

(56) References Cited

U.S. PATENT DOCUMENTS

| 6,045,930 | A | 4/2000 | Thompson et al. |
| 6,232,264 | B1 | 5/2001 | Lukehart et al. |
| 6,322,901 | B1 | 11/2001 | Bawendi et al. |
| 6,721,083 | B2 | 4/2004 | Jacobson et al. |
| 2003/0096113 | A1 | 5/2003 | Jacobson et al. |

FOREIGN PATENT DOCUMENTS

| WO | 2005052996 A2 | 6/2005 |
| WO | 2005052996 A3 | 6/2005 |

OTHER PUBLICATIONS

International Search Report for International Application No. PCT/US2004/038807 Dated Jul. 5, 2005.
Alivisatos, A. P., et al., " Semiconductor clusters, nanocrystals, and quantum dots," Science, New Series, Feb. 16, 1996, vol. 271, No. 5251, pp. 933-937.
Bukowski, Tracie J., et al., "Quantam dot research: current state and future prospects, " Critical Reviews in Solid State and Materials Sciences, 2002, vol. 27, No. 3/4, pp. 119-142, CRC Press, Inc.

(Continued)

*Primary Examiner* — Robert M Kunemund
(74) *Attorney, Agent, or Firm* — Conley Rose, P.C.; Rodney B. Carroll

(57) ABSTRACT

New methods for the synthesis of nanocrystals/quantum dots are disclosed. The methods comprise use of reasonably-priced and commercially available heat transfer fluids (such as Dowtherm® A) as solvents to synthesize CdSe nanocrystals. Separation of nucleation and growth is achieved by quenching the reaction solution with relatively cold (room temperature) solvent to lower the solution temperature. Quenching may be followed by raising the solution temperature, to allow controlled growth to take place.

46 Claims, 8 Drawing Sheets

OTHER PUBLICATIONS

Dabbousi, B. O., et al., "(CdSe)ZnS core-shell quantum dots: synthesis and characterization of a size series of highly luminescent nanocrystallites," The Journal of Physical Chemistry B, 1997, vol. 101, pp. 9463-9475, American Chemical Society.

Duan, Xiangfeng, et al., "General synthesis of compound semiconductor nanowires," Advanced Materials, 2000, vol. 12, No. 4, pp. 298-302, Wiley-VCH.

Katari, J. E. Bowen, et al., "X-ray photoelectron spectroscopy of CdSe nanocrystals with applications to studies of the nanocrystal surface," The Journal of Physical Chemistry, 1994, vol. 98, pp. 4109-4117, American Chemical Society.

Manna, Liberato, et al., "Synthesis of soluble and processable rod-, arrow-, teardrop-, and tetrapod-shaped CdSe nanocrystals," Journal of the American Chemical Society, 2000, vol. 122, pp. 12700-12706, American Chemical Society.

Murray, C. B., et al., "Synthesis and characterization of monodisperse nanocrystals and close-packed nanocrystal assemblies," Annual Review of Materials Science, 2000, vol. 30, pp. 545-610, Annual Reviews.

Murray, C. B., et al., "Synthesis and characterization of nearly monodisperse CdE (E=S, Se, Te) semiconductor nanocrystallites," Journal of the American Chemical Society, 1993, vol. 115, pp. 8706-8715, American Chemical Society.

Peng, Xiaogang, et al., "Kinetics of II-VI and III-V colloidal semiconductor nanocrystal growth: "focusing" of size distributions," Journal of the American Chemical Society, 1998, vol. 120, pp. 5343-5344, American Chemical Society.

Peng, Z. Adam, et al., "Mechanisms of the shape evolution of CdSe nanocrystals," Journal of the American Chemical Society, 2001, vol. 123, pp. 1389-1395, American Chemical Society.

Qu, Lianhua, et al., "Alternative routes toward high quality CdSe nanocrystals," Nano Letters, 2001, vol. 1, No. 6, pp. 333-337, American Chemical Society.

Qu, Lianhua, et al., "Control of photoluminescence properties of CdSe nanocrystals in growth," Journal of the American Chemical Society, 2002, vol. 124, No. 9, pp. 2049-2055, American Chemical Society.

Wang, Y. Andrew, et al., "Stabilization of inorganic nanocrystals by organic dendrons," Journal of the American Chemical Society, 2002, vol. 124, No. 10, pp. 2293-2298, American Chemical Society.

Yu, W. William, et al., "Formation of high-quality CdS and other II-VI semiconductor nanocrystals in noncoordinating solvents: tunable reactivity of monomers," Angewandte Chemie International Edition, 2002, vol. 41, No. 13, pp. 2368-2371, Wiley-VCH.

Foreign Communication from a related counterpart application—International Preliminary Report on Patentability, PCT/US2004/038807, May 22, 2006, 4 pages.

SOLVENTS AND NEW METHOD FOR THE SYNTHESIS OF CDSE SEMICONDUCTOR NANOCRYSTALS

BACKGROUND OF THE INVENTION

1. Technical Field of the Invention

This invention relates to the synthesis of nanoparticles, also known as nanocrystallites or quantum dots. In particular, quantum dots are synthesized using new solvents. More particularly, a nucleation step is separated from the growth process by quenching the reaction solution with cold solvent.

2. Description of the Related Art

Semiconductor nanocrystals are of great importance for both fundamental and application purposes. The optical and electrical properties of quantum dots are size-dependent, which makes them attractive for many applications. (See, for example, Alivisatos, A. P., *Science* 271, 933-937 (1996); Murray et al., Annual Review of Materials Science 30, 545-610 (2000).) Intensive research has been done in this area in the last few decades. Bukowski and Simmons (*Critical Reviews in Solid State and Materials Science* 27, 119-142 (2002)) describe many potential applications for semiconductor nanocrystals, such as quantum dot infrared photodetectors, quantum dot lasers, and photovoltaic devices.

Murray et al. reported the synthesis of high-quality CdE (E=S, Se, Te) nanocrystals through the rapid injection of organometallic reagents (trioctylphosphine selenide [TOPSe], or trioctylphosphine telluride [TOPTe] with a cadmium source (dimethylcadmium) [Me$_2$Cd] dissolved in trioctylphosphine [TOP]) into a hot coordinating solvent (trioctylphosphine oxide [TOPO]) followed by size selective precipitation (*Journal of the American Chemical Society* 115, 8706-8715 (1993)). (See also Katari, et al., *Journal of Physical Chemistry* 98, 4109-4117 (1994).)

In their work, Dabbousi et al. described the synthesis and characterization of a series of core-shell (CdSe)ZnS nanocrystals with CdSe cores diameter ranging from 2.3 to 5.5 nm. A quantum yield of (30-50%) and photoluminescence characterized by FWHM of less than 40 nm were achieved. The nanocrystals were synthesized via the pyrolysis of Cd(CH$_3$)$_2$ and TOPSe in a coordinating solvent (TOPO) (*Journal of Physical Chemistry B* 101 9463-9475 (1997)). See also U.S. Pat. No. 6,322,901 to Bawendi et al.

A systematic shape variation (nanorods, arrows, teardrops, and tetrapods) of nanocrystals has been achieved via synthesizing the nanoparticles in a mixture of hexylphosphonic acid and trioctylphosphine oxide. The ratio of surfactants, injection volume, and monomer concentration are the main factors in nanoparticle shape control. Ostwald ripening occurs at low monomer concentrations, whereas at high monomer concentrations the differences in the growth rates of different faces may lead to different shape configurations (Manna et al., *Journal of the American Chemical Society* 122, 12700-12706 (2000)).

Peng and Peng further explored the temporal shape evolution of CdSe nanorods in trioctylphosphine oxide solvent. (*Journal of the American Chemical Society* 123, 1389-1395 (2001)). Nanocrystals grow exclusively along the c-axis of the wurtzite structure at high monomer concentrations, whereas, at intermediate monomer concentrations, the growth is simultaneously in three dimensions. On the other hand, at low monomer concentrations, the intraparticle diffusion on the surface of the nanocrystal decreases the aspect ratio. Moreover, at lower monomer concentrations Ostwald ripening takes place (Peng and Peng, (2001) and Peng et al., *Journal of the American Chemical Society* 120, 5343-5344 (1998)).

Duan and Lieber reported the synthesis of a broad range (III-V, II-VI, and IV-IV) of semiconductor nanowires with diameters ranging from three to tens of nanometers and lengths up to tens of micrometers using laser-assisted growth (*Advanced Materials* 12, 298-302 (2000)).

In an important development, CdSe nanocrystals have been reported to be synthesized using safer and lower cost alternative routes. Fatty acids, amines, phosphine oxides, and phosphonic acids are among those solvent systems used. Moreover, CdO was found to be a more desirable source of cadmium for the synthesis of nanocrystals compared to Cd(CH$_3$)$_2$ (Qu et al., *Nano Letters* 1, 333-337 (2001)). Different varieties of elongated shapes were synthesized using these alternative routes. The magic size nuclei and the concentration of the remaining monomers after the initial nucleation stage are claimed to be the determining factors of the shape configuration of the nanostructured particles (Peng and Peng, *Journal of the American Chemical Society* 123, 1389-1395 (2001)). In another study, Qu and Peng concluded that during the growth of nanocrystals under a given set of initial conditions, photoluminescence quantum yield increases to a maximum value (bright point) before it gradually decreases. This maximum value is said to be a signature of an optimal surface structure (*Journal of the American Chemical Society* 124, 2049-2055 (2002)).

In an effort to set the basis for developing photoluminescence-based labeling reagents, the chemistry of the CdSe dendron-nanocrystals was investigated. Dendron ligands were used to stabilize CdSe and Au nanocrystals. Hydrophilic organic dendron ligands were designed to stabilize semiconductor and noble metal nanocrystals by binding onto the surface of the nanocrystal (Wang et. al, *Journal of the American Chemical Society* 124, 2293-2298 (2002)).

Recently, Yu and Peng successfully synthesized II-VI semiconductor nanocrystals in non-coordinating solvents. CdS, CdSe, and ZnSe nanocrystals were synthesized in octadecene (ODE) with oleic acid (OA) as a ligand to stabilize the nanocrystals and the cationic precursors. The growth rate of nanocrystals was found to be dependent on the concentration of oleic acid in ODE. As the concentration of OA in ODE increases, the growth rate increases (*Angewandte Chemie International Edition* 41, 2368-2371 (2002)).

The choice of solvent for the synthesis of nanocrystals is of great importance, particularly for the purpose of scaling up the production of nanoparticles to achieve commercial nanomanufacturing and mass production. Nanocrystals are currently commercially available (e.g., from Quantum Dot Corp., Hayward, Calif.; Evident Technologies, Troy, N.Y.) but are relatively expensive. The present invention provides new methods to achieve low cost using commercially available solvents for the synthesis of semiconductor nanocrystals, which may have a significant effect on the economic feasibility of commercializing the synthesis of nanoparticles. DOWTHERM®, which is a well known heating fluid and a registered trademark of Dow Chemical Company, a Michigan corporation, has now been used successfully as a solvent to synthesize CdSe quantum dots. Moreover, phenyl ether and biphenyl, which are the constituents of Dowtherm A, were used individually as solvents for the synthesis of CdSe nanocrystals, as was THERMINOL® 66 heat transfer fluid, manufactured by Solutia, Inc.

Another feature of the present invention is the separation of nucleation and growth through quenching the synthesis by adding a certain amount of the relatively cold solvent (about room temperature) into the reaction solution immediately after injecting the selenium solution.

BRIEF SUMMARY OF SOME OF THE PREFERRED EMBODIMENTS

It is thus an object of the present invention to overcome the deficiencies of the prior art and thereby to provide new and economical methods for the synthesis of nanocrystals (quantum dots) using heat transfer fluid solvents.

As will be described in more detail below, we have found that quantum dots can preferably be synthesized by combining appropriate precursors in synthesis mixtures comprising solvents including heat transfer fluids. By way of illustration and not limitation, the preferred heat transfer fluids may be selected from the group consisting of heat transfer fluids and their individual components, alkylated aromatics, aryl ethers, isomers of alkylated aromatics, alkyl benzenes, Dowtherm® A (DTA), biphenyl (BP), phenyl ether (PE), Dowtherm® G, Dowtherm® RP, Dowtherm® Q, Dowtherm® J, Dowtherm® HT, Dowtherm® T, Dowtherm® MX, terphenyls, Therminol® 66, and combinations thereof. Preferred metal precursors include Cd, Pb, Zn, Ga, In, their oxides, other salts, and combinations thereof. Nanocrystals of all types may be prepared by the inventive methods but currently preferred are nanocrystals comprising CdS, CdSe, CdTe, PbSe, PbTe, ZnS, ZnSe, GaAs, InSb. In some preferred embodiments, the precursor solution may comprise oleic acid.

We have also found in accordance with the present invention that the nanocrystal nucleation step can by separated from the growth process by quenching the reaction solution with cold solvent. The preferred quench solvent may be selected from the heat transfer fluids previously listed, namely heat transfer fluids and their individual components, alkylated aromatics, aryl ethers, isomers of alkylated aromatics, alkyl benzenes, Dowtherm® A (DTA), biphenyl (BP), phenyl ether (PE), Dowtherm® G, Dowtherm® RP, Dowtherm® Q, Dowtherm® J, Dowtherm® HT, Dowtherm® T, Dowtherm® MX, terphenyls, Therminol® 66. In some preferred embodiments, additional amounts of precursor materials may be added after the synthesis mixture has been quenched. In other preferred embodiments, the quenched synthesis mixture may be reheated. Additional precursor material may be added after quenching and before reheating to grow core/shell nanoparticles or moderate nanoparticle size. In still other preferred embodiments, multiple precursor materials may be simultaneously injected into the solvent/heat transfer fluid.

In some preferred embodiments, the method for making nanocrystals comprises forming a solution-A comprising precursor (A) and a first solvent; forming a mixture-B comprising precursor (B) and a second solvent; forming a hot solution-B by heating mixture-B to a predetermined temperature greater than the temperature of solution-A; forming a synthesis mixture by injecting solution-A into hot solution-B; forming semiconductor nanocrystals in the synthesis mixture; and quenching the synthesis mixture by adding a relatively cool volume of the second solvent. In other preferred embodiments, the method comprises dissolving a precursor of a desired element in a first solvent to form a precursor solution; mixing a metal oxide with a second solvent to form a mixture; heating the mixture to a predetermined temperature; injecting the precursor solution into the heated mixture to form a growth solution; and quenching the growth solution. The growth solution may preferably be quenched using one or more of the heat transfer fluids described above. Other preferred embodiments may further comprise adding additional amounts of precursors and/or reheating the quenched solution. In some preferred embodiments, the solution may be heated to a temperature in the range of about 200° C. to about 300° C., more preferably between about 220° C. and about 260° C., most preferably about 250° C. In other preferred embodiments, the precursor solutions may be injected in a time of about 2 seconds or less, more preferably one second or less. Other preferred embodiments comprise cooling the growth/synthesis mixture to less than 200° C., more preferably less than 150° C., still more preferably less than 120° C. Still other preferred embodiments comprise use of solvents selected from the group consisting of inorganic solvents, silicone oils, related siloxane compounds having a backbone of Si—O—Si bonds, fluorinated solvents, phenylated compounds, and combinations thereof.

The present invention thus offers several advantages over previously known techniques, including significantly lower priced, commercially available, and more environmentally friendly solvents for the synthesis of nanocrystals/nanoparticles/quantum dots, and better control over the properties thereof by quenching the synthesis mixture to separate the nucleation step and growth process.

BRIEF DESCRIPTION OF THE DRAWING FIGURES

Figure 1:
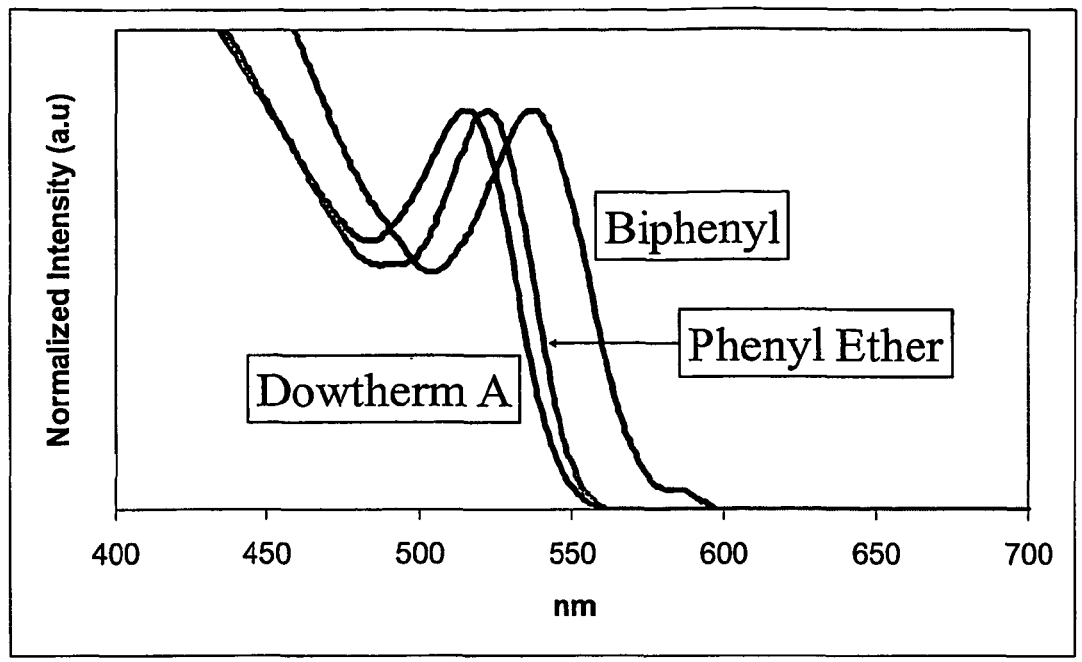
FIG. 1 shows UV-Vis Absorption spectra for the CdSe nanocrystal synthesized in different solvents (Dowtherm A, biphenyl, and phenyl Ether) at 160° C.
Figure 2:
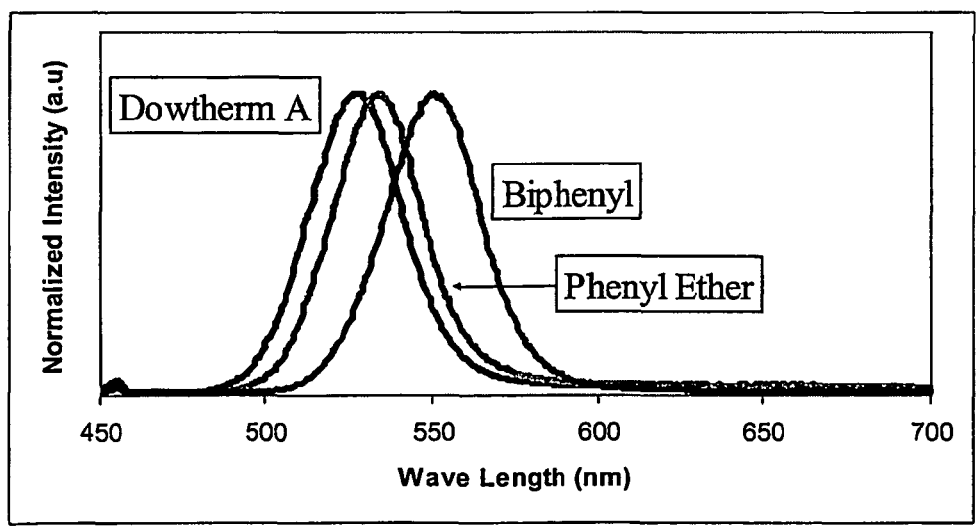
FIG. 2 shows fluorescence spectra for the CdSe nanocrystal synthesized in different solvents (Dowtherm A, biphenyl, and phenyl Ether) at 160° C.
Figure 3:
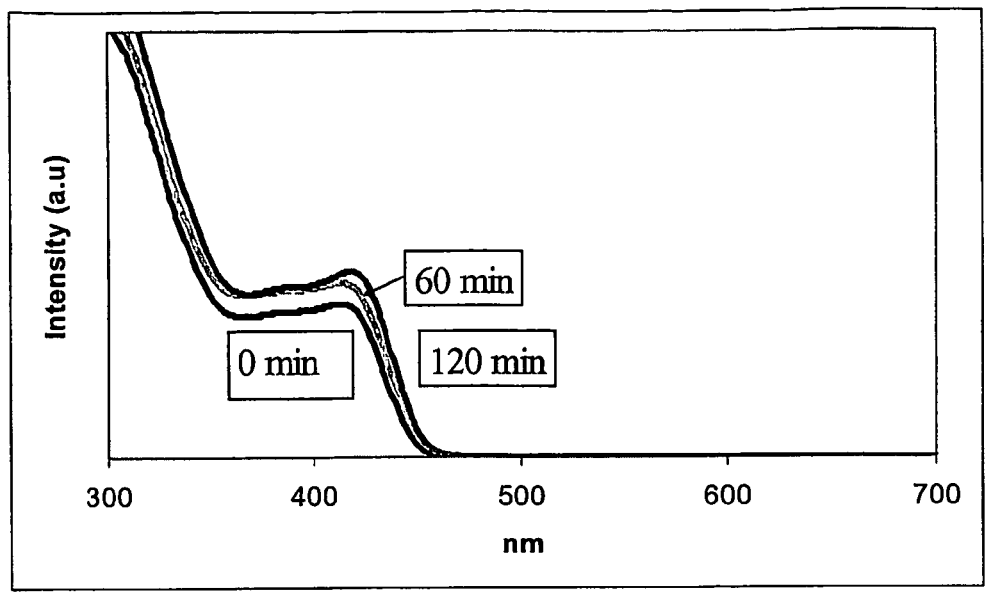

FIG. 3 provides UV-Vis spectra for CdSe quantum dot synthesized in ODE at 100° C. showing no significant growth with time.

Figure 4:
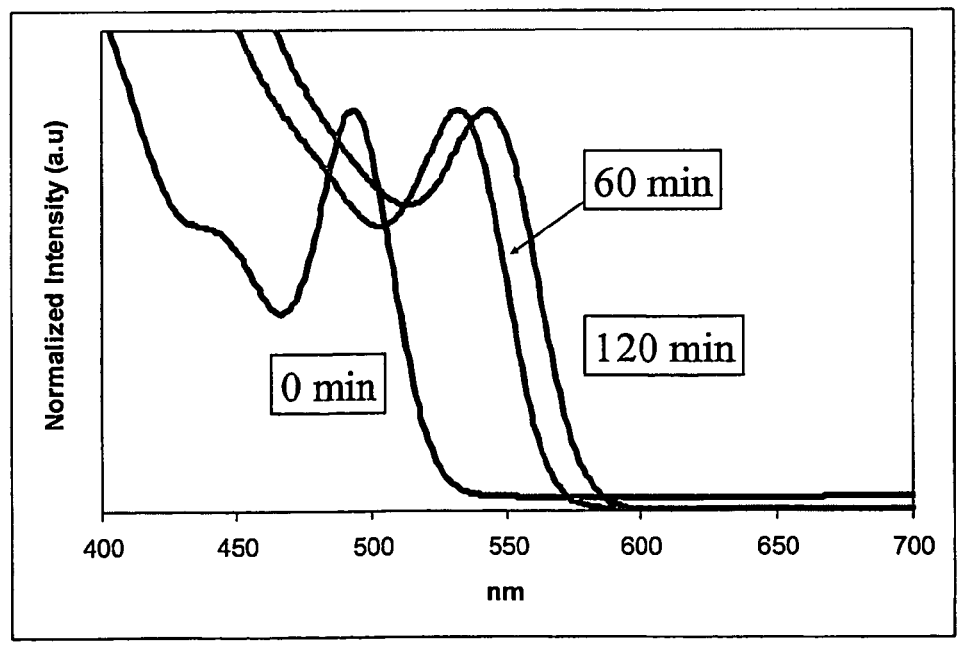

FIG. 4 provides UV-Vis spectra for CdSe nanocrystals synthesized in ODE showing the growth of nanoparticles with time at 160° C.

Figure 5:
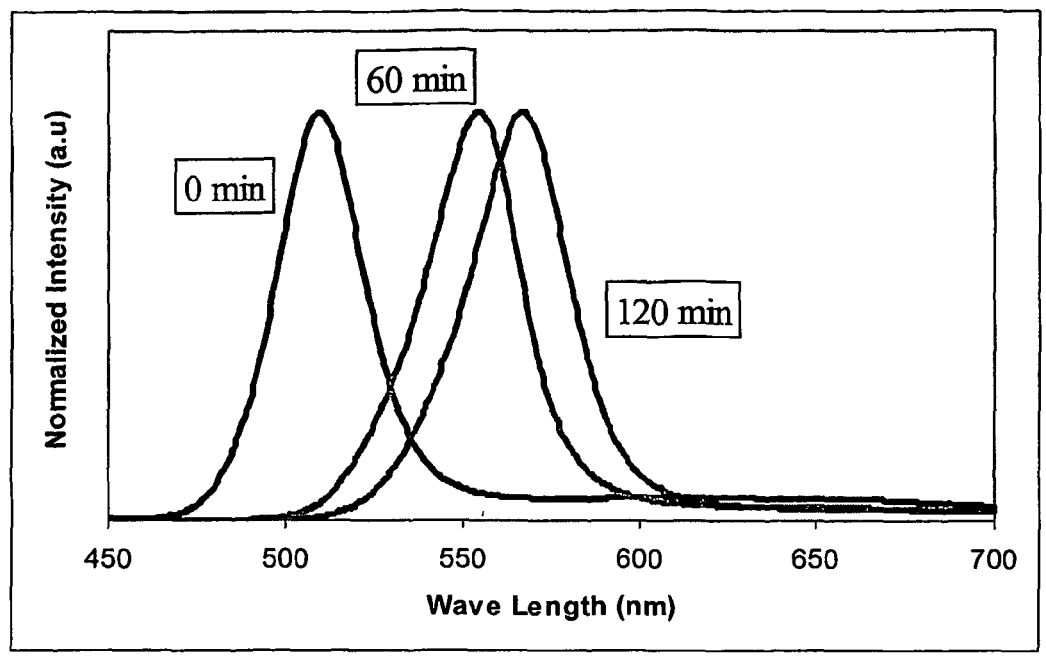

FIG. 5 provides fluorescence Spectra for CdSe nanocrystals synthesized in ODE showing the growth of nanoparticles with time at 160° C.

Figure 6:
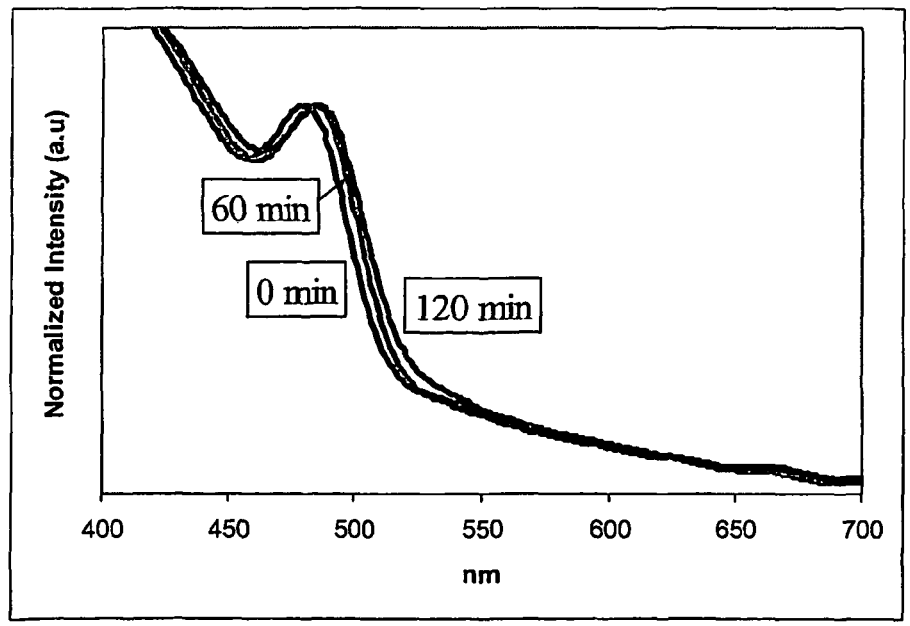

FIG. 6 provides UV-Vis Spectra for CdSe quantum dot synthesized in Dowtherm A at 100° C. showing no significant growth with time.

Figure 7:
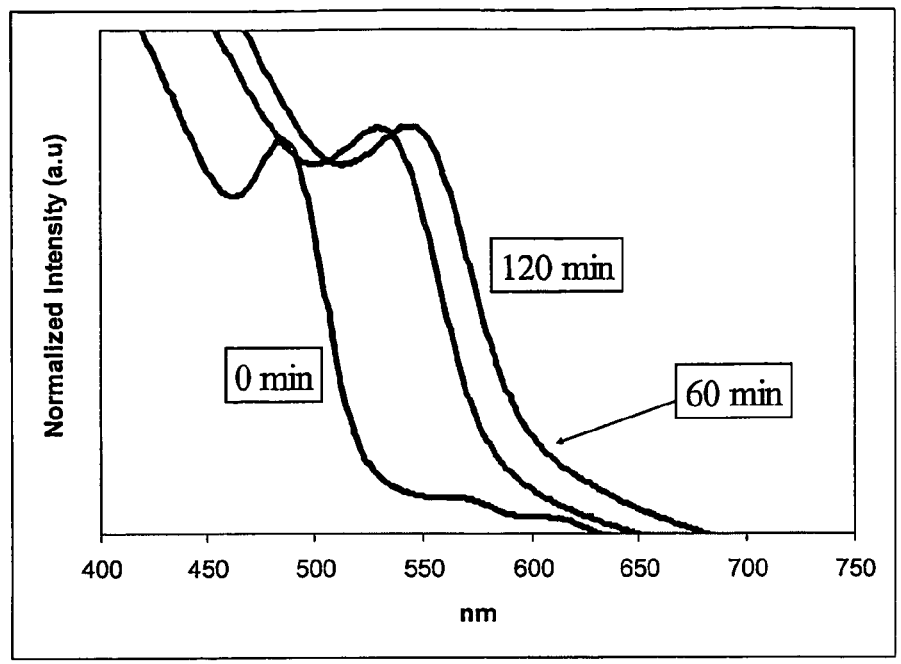

FIG. 7 provides TV-Vis Spectra for CdSe quantum dot synthesized in Dowtherm A at 160° C. showing no significant growth with time.

Figure 8:
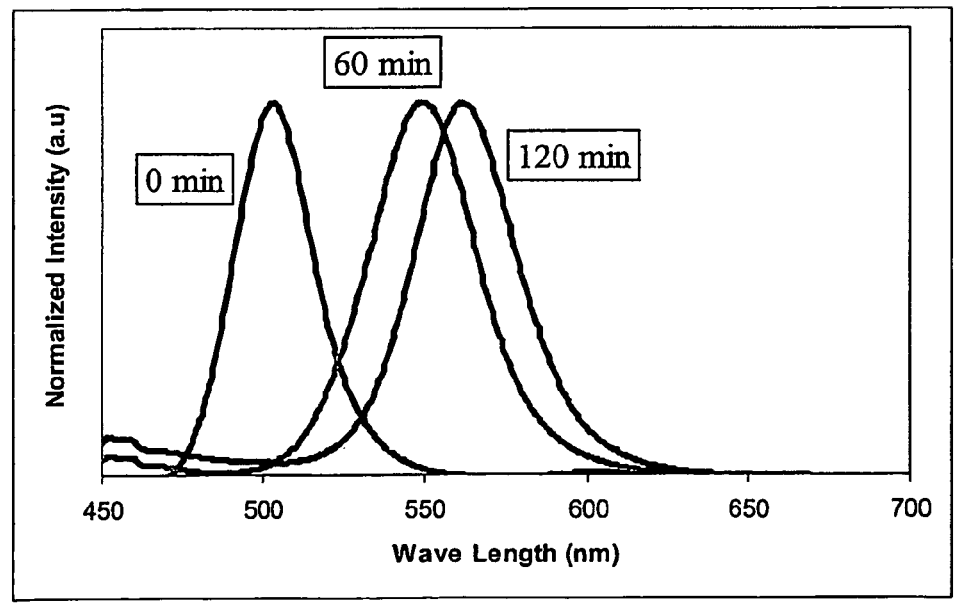

FIG. 8 provides fluorescence Spectra for CdSe quantum dot synthesized in Dowtherm A at 160° C. showing no significant growth with time.

Figure 9:
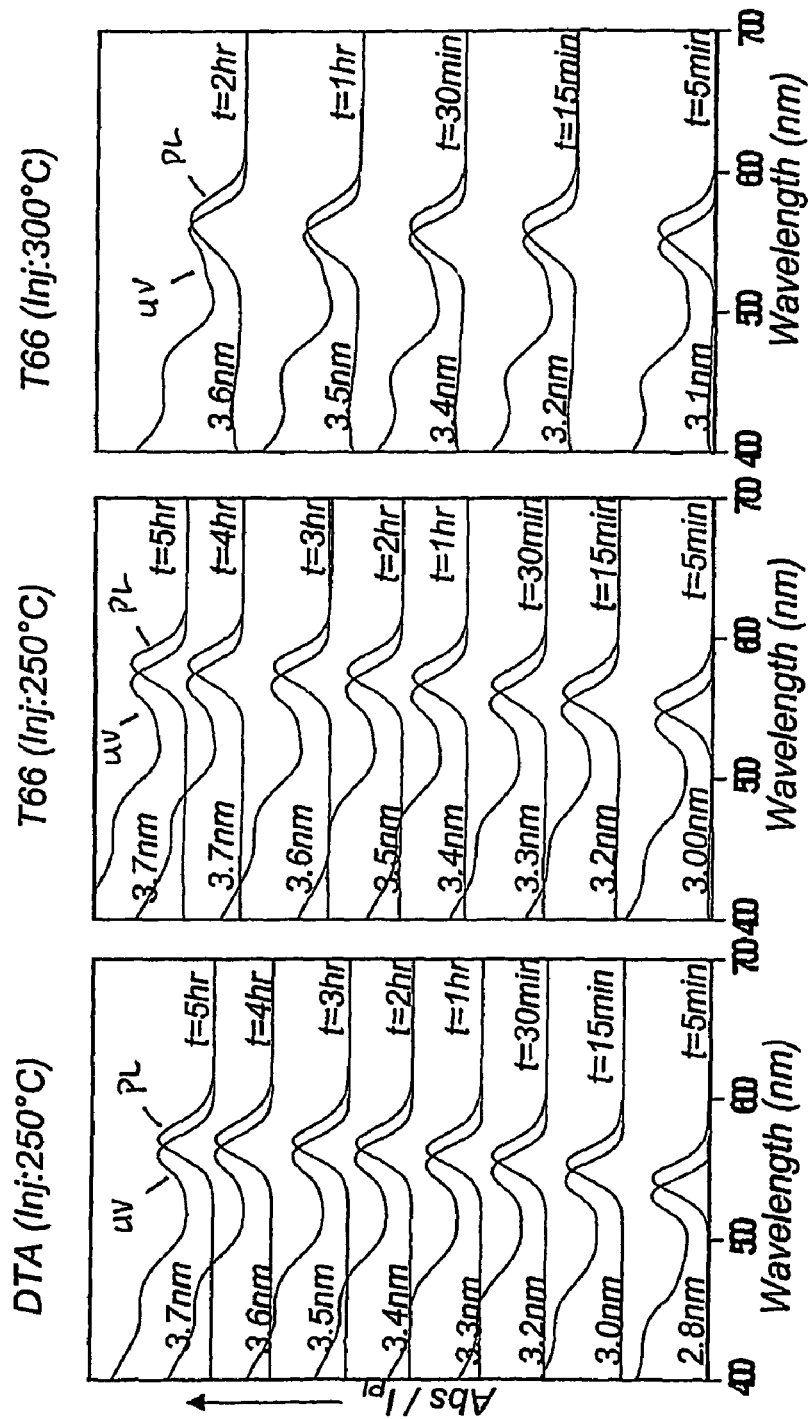

FIG. 9 provides UV-Vis and PL spectra of CdSe quantum dot synthesized in Dowtherm A at 250° C. and Therminol 66 at 250° C. and 300° C. showing particle growth with time.

Figure 10:
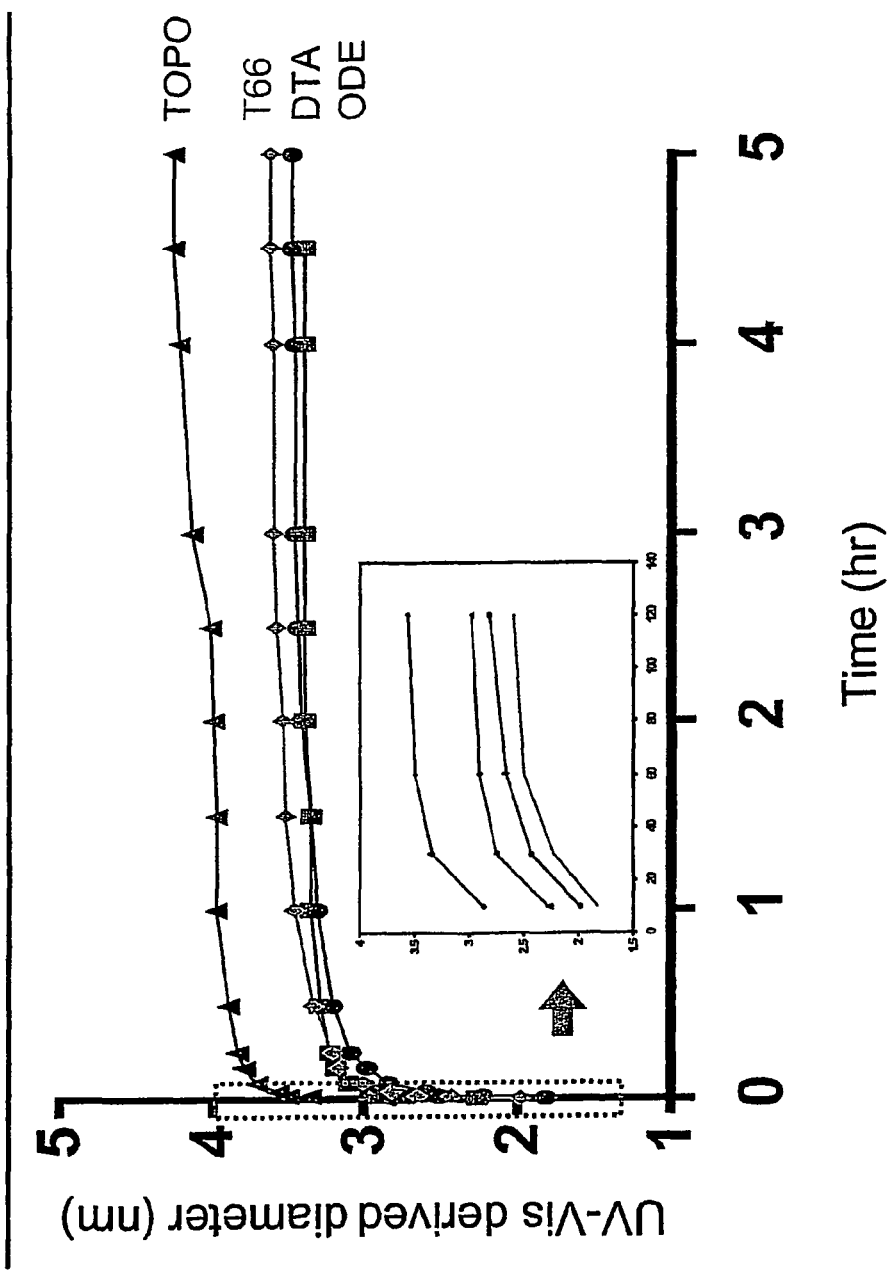

FIG. 10 shows particle growth (UV-Vis derived diameter) with time for various solvents.

Figure 11:
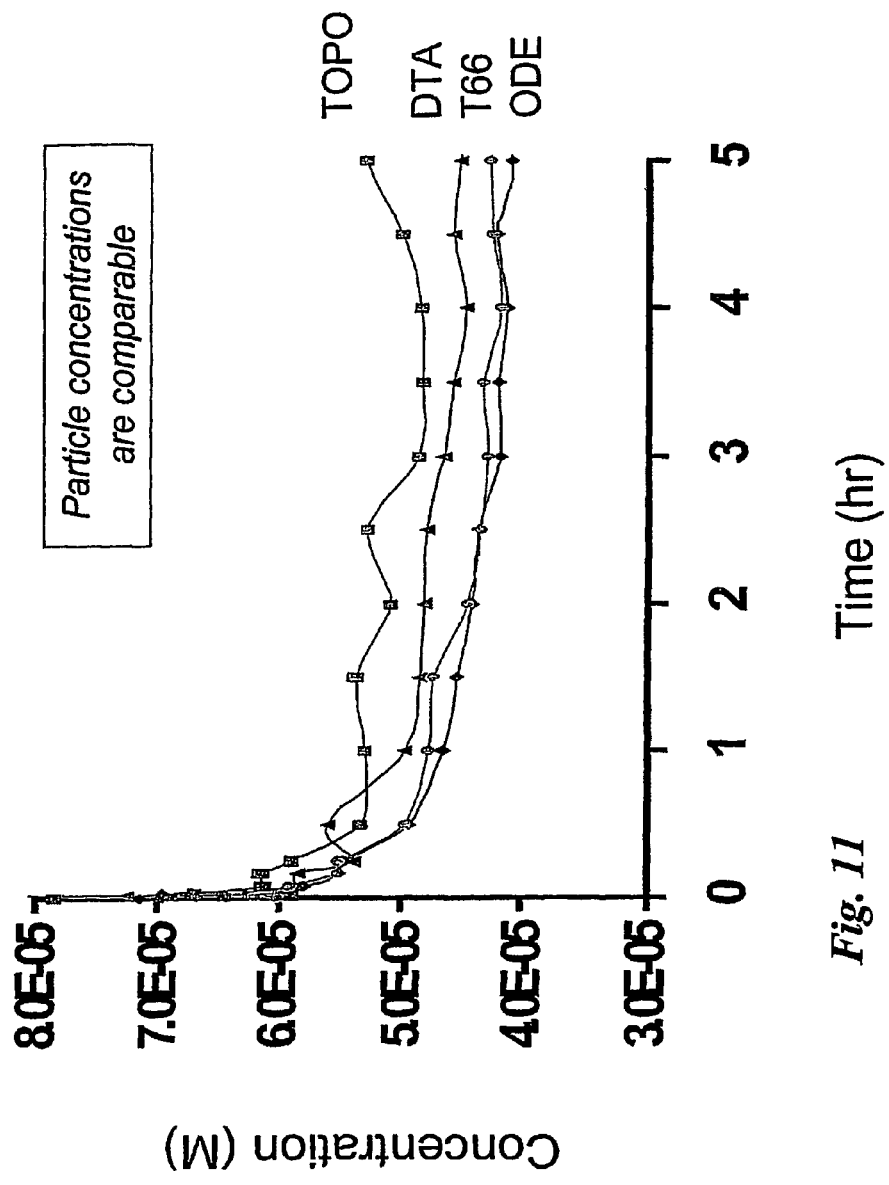

FIG. 11 shows particle concentration with time corresponding to FIG. 10 illustrating that particle concentrations are comparable.

Figure 12:
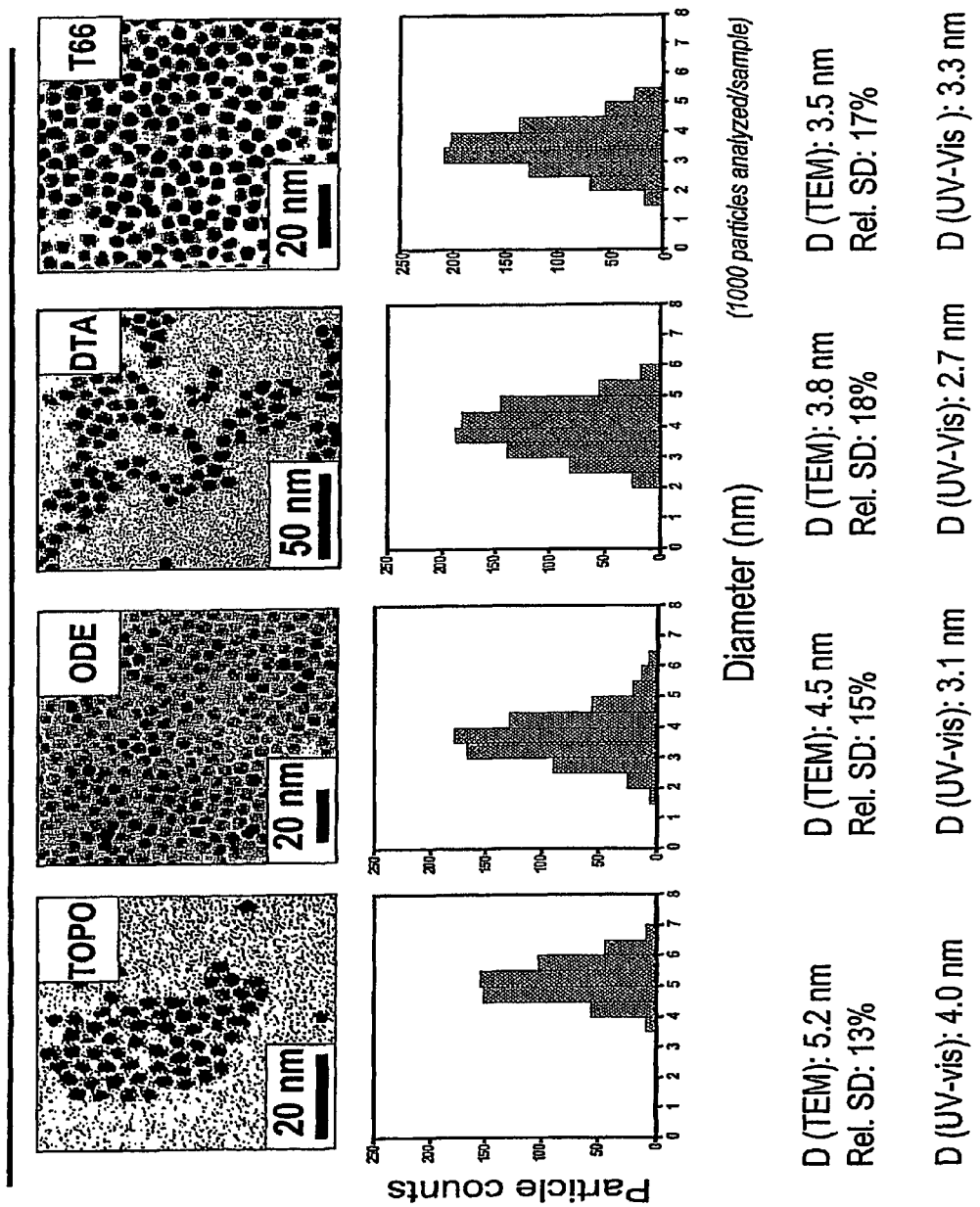

FIG. 12 provides size distribution data for CdSe quantum dots synthesized at 220° C. for 1 hr in various solvents.

DETAILED DESCRIPTION OF THE PREFERRED EMBODIMENTS

Herein will be described in detail specific preferred embodiments of the present invention, with the understanding that the present disclosure is to be considered an exemplification of the principles of the invention, and is not intended to limit the invention to that illustrated and described herein. The present invention is susceptible to preferred embodiments of different forms or order and should not be interpreted to be limited to the specifically expressed methods or compositions contained herein. In particular, various preferred embodiments of the present invention provide a number of different configurations and applications of the inventive method, compositions, and their applications.

EXAMPLES

New Solvents for Quantum Dot Synthesis

We successfully synthesized CdSe nanocrystals in Dowtherm A (DTA) heating fluid, biphenyl (BP), and phenyl ether (PE). Dowtherm A is "a eutectic mixture of two very stable compounds, biphenyl ($C_{12}H_{10}$) and diphenyl oxide ($C_{12}H_{10}O$)" (See attached Appendix.). The availability and the low cost of Dowtherm A make it an attractive choice for the synthesis of nanoparticles, and particularly for future commercial production. Moreover, Dowtherm A is liquid at room temperature (m.p.=12° C.), which makes it easier to handle through the synthesis process. Table (1) shows a comparison of the price of Dowtherm A with respect to other solvents.

TABLE 1

Comparison of the prices of different solvents

| Solvent | Price ($/L) | b.p. (° C.) | m.p. (° C.) |
|---|---|---|---|
| TOPO (from ALDRICH) | 158 | >360 | 52 |
| ODE (from ALDRICH) | 23 | 315 | 18 |
| DT (biphenyl and diphenyl oxide) (from Dow Chemicals) | 3 | 257 | 12 |
| T66 (modified terphenyls) (from Solutia Inc.) | 10 | 359 | 0 |

We adapted the synthesis method of CdSe nanocrystals reported by Yu and Peng (*Angewandte Chemie International Edition* 41, 2368-2371 (2002)) with some changes. Selenium precursor was prepared by dissolving selenium powder into trioctylphosphine (TOP) (Se/TOP=1/8 molar ratio). CdO was mixed with Dowtherm A fluid (or phenyl ether or biphenyl) and oleic acid (OA) at room temperature (Cd/DTA=1/300 molar ratio) and (Cd/OA=1/3 molar ratio). The solution was heated up to 260° C. under vigorous stirring for 30 minutes or until the solution cleared up. Selenium solution was swiftly injected into the Dowtherm/CdO/OA solution. The injection temperature was varied from 220 to 260° C., compared to 300° C. used by Yu and Peng. CdSe nanocrystals formed as indicated by the change in color for the reaction solution and verified by the UV-Vis and fluorescence spectroscopy analysis.

FIGS. (1) & (2) show the UV-Vis and fluorescence spectra for the CdSe nanocrystals synthesized in Dowtherm A, biphenyl, or phenyl ether solvents at 160° C. The FWHM of the fluorescence peaks and the particle size of the nanocrystals are shown in Table (2).

TABLE 2

Comparison of the particle size and particle size distribution for CdSe quantum dots synthesized in different solvents (Dowtherm A, biphenyl, and phenyl ether)

| Solvent | FWHM (nm) | Particle Size (nm) |
|---|---|---|
| Dowtherm A | 32 | 2.4 |
| Phenyl Ether | 31 | 2.5 |
| Biphenyl | 33 | 2.8 |

The FWHM values for CdSe nanocrystals synthesized in these new solvents (DTA, PE, and BP) are comparable to what is reported in the literature for other solvents such as octadecene (ODE) and trioctylphosphine oxide (TOPO). The FWHM is an indication of the monodispersity of the nanoparticles.

Further investigation of the synthesis of CdSe nanocrystals in Dowtherm A solvent is demonstrated in the next section (Quenching Methods)

Quenching Methods

We successfully separated the nucleation step from the growth process by quenching the reaction mixture with relatively cold solvent (at room temperature) immediately after injecting the selenium solution. Injecting the selenium solution at high temperature will start the nucleation of the nanoparticles. Quenching the reaction mixture immediately after the injection will drop the temperature to a level where no more nucleation will take place and no growth of the nucleus will be possible. Temperature will then be raised to the desired level to allow the nucleus to grow. This method will not only allow us to separate nucleation from growth, but also will allow us to choose the desired growth temperature and as a result choose the desired average particles size.

To further explain this concept, we conducted a set of experiments with different solvents including ODE and Dowtherm A.

ODE/CdO solution was heated up to 300° C. under vigorous stirring until the solution cleared. The solution temperature was dropped to 260° C. and selenium solution was swiftly injected, followed by quenching the reaction solution with relatively cold (room temperature) ODE (1:1 by volume). The temperature of the reaction solution dropped to 100° C. The reaction solution was kept at 100° C. for two hours to monitor any growth by taking aliquots every 30 minutes and analyzing them using the UV-Vis and fluorescence spectroscopy (FIG. 3). As demonstrated by FIG. (3), a very little (if any) shift in the CdSe absorption peak is observed over the two hours period, indicating that there is virtually no growth at this temperature.

In another experiment, the same steps were followed except that after quenching the reaction solution to 100° C., the temperature was raised to 160° C. and kept at that level for two hours to monitor the growth of the particles. The UV-Vis and fluorescence spectra of the samples taken during this period (FIGS. (4) & (5)) show that nanocrystals grow with time from 2.2 nm immediately after raising the temperature to 160° C. to 2.9 nm at the end of the second hour. A product yield (based on Se) as high as 98% and a FWHM as low as 26 nm were achieved (Table 3).

TABLE 3

CdSe Quantum dot synthesized in octadecene at 160° C.

| Time (min) | FWHM | Particle Size (nm) | Product Yield (%) | Total Yield (mg/ml) |
|---|---|---|---|---|
| 0 | 26.6 | 2.2 | 60.2 | 0.60 |
| 10 | 32.9 | 2.4 | 64.4 | 0.64 |
| 30 | 33.5 | 2.5 | 76.5 | 0.76 |
| 60 | 33.5 | 2.7 | 90.5 | 0.90 |
| 90 | 33.8 | 2.8 | 95.4 | 0.95 |
| 120 | 34.1 | 2.9 | 98.5 | 0.98 |

If there were no quenching and the solution were left at an elevated temperature, the particles would grow very quickly and be much larger than particles produced using the present method.

A similar experiment to synthesize CdSe quantum dots in Dowtherm A was conducted using the quenching method. The reaction solution was quenched with cold solvent (Dowtherm A) immediately after injecting the TOPSe solution into the reaction vessel. The temperature dropped to 100° C. and was kept at that level for two hours. No significant growth was observed (FIG. 6). In another experiment, the same steps were followed except that temperature was raised from 100 to 160° C. immediately after quenching the reaction solution with cold Dowtherm A and was kept at that level for two hours. As illustrated by FIGS. (7) and (8) the nanoparticles grew with time from 2.1 nm to 3 nm at the end of 2 hours. This shows that quenching the reaction solution with the appropriate amount of cold solvent immediately after introducing the selenium precursor will enable us to separate the nucleation step from the growth process.

As will be recognized by one of skill in the art, the present invention is extremely amenable to variations. For example, it will be clear to those skilled in the art that cadmium sulfide (CdS) nanoparticles and cadmium telluride (CdTe) nanoparticles can be synthesized in Dowtherm A as a solvent without departing from the scope of the present invention.

Various nanoshapes can be produced using Dowtherm A as a solvent, including but not limited to: rods, arrows, teardrop, tetrapods, and other shapes known to those skilled in the art. Further, an organic compound such as one or more alkylphosphonates can be added to chemically bind to the surface of the growing particle, thereby affecting the relative growth rates of the crystal faces. As mentioned above, the ratio of surfactants, injection volume, and monomer concentration are known factors in nanoparticle shape control. The timing of the addition of additional compounds, as well as that of additional nanoparticle precursors, to the reaction medium post-quenching should be controlled in order to optimize the desired results. Optimum timing can be, determined by theoretical or computational modeling or by experimentation.

Additionally, various types of Dowtherm can be used successfully for synthesis of nanocrystals, including those listed in Table 4 below. Also, other heat transfer fluids and their individual components may be successfully be used with the present invention, including, without limitation, heat transfer fluids, alkylated aromatics, aryl ethers, isomers of alkylated aromatics, alkyl benzenes, Dowtherm A (DTA), biphenyl (BP), phenyl ether (PE), Dowtherm G, Dowtherm RP, Dowtherm Q, Dowtherm J, Dowtherm HT, Dowtherm T, Dowtherm MX, terphenyls, Therminol 66, and combinations thereof.

TABLE 4

Different types of Dowtherm

| Solvent | Composition | Melting point (° C.) | Boiling point (° C.) |
|---|---|---|---|
| Dowtherm G | di-/tri-aryl ethers | 4 | 288 |
| Dowtherm RP | diaryl alkyl | | 353 |
| Dowtherm Q | diphenylethane and alkylated aromatics | | 267 |
| Dowtherm J | isomers of an alkylated aromatic | <−81 | 181 |
| Dowtherm HT | modified terphenyl fluid | | 345 |
| Dowtherm T | $C_{14}$-$C_{30}$ alkyl benzenes | | 210 |
| Dowtherm MX | alkylated aromatics | | 328 |

Solvents with molecular structures similar to the above-listed solvents are expected to provide similar results. Suitable solvents have a high boiling point, are relatively inert, i.e. meaning having a high decomposition temperature, and are preferably but not necessarily liquid at room temperature. Phenylated solvent molecules are preferred in some embodiments, particularly terphenyls. While the solvents mentioned above are organic, inorganic solvents, such as silicone oil and related siloxane compounds (where the molecule backbone is composed of Si—O—Si bonds), satisfy the above criteria and should be capable of successful use with the method described herein. Fluorinated solvents are also expected to work.

Solvent/Heat Transfer Fluid Tests

Additional growth experiments using the quench method of the present invention were performed as described above in various solvents listed below in Table 5. "T66" indicates Therminol® 66 manufactured by Solutia Inc.

TABLE 5

CdSe Quantum dots synthesized in various solvents

| Solvent | UV-Vis derived size (nm) | FWHM of PL peak (nm) | Quantum Yield (%) | Time (sec) |
|---|---|---|---|---|
| TOPO | 2.7 | 42 | 16 | 10 |
| ODE | 2.7 | 27 | 14 | 120 |
| DTA | 2.7 | 24 | 8 | 600 |
| T66 | 2.7 | 26 | 5 | 360 |

The UV-Vis and PL spectra of the nanocrystals thus produced are presented in FIG. 9. FIGS. 10 and 11 illustrate nanoparticle growth rate with time for various solvents. FIG. 12 provides size distribution data for CdSe nanocrystals synthesized after 1 hour at 220° C. These data illustrate that the properties of nanocrystals may be tailored or tuned by appropriate selection of synthesis conditions, including solvent(s), temperature (including injection temperature, synthesis temperature, quench temperature, reheat temperature), time parameters (injection time, quench time, synthesis time, reheat time, and the time-temperature profile of the synthesis mixture, among others. Accordingly, the present invention now makes possible the economical production of nanocrystals having predetermined properties that can be tailored or tuned to specific applications. Furthermore, additional precursor material may be added after quenching and before reheating to grow core/shell nanoparticles or moderate nanoparticle size.

The initial high-temperature stage ("nucleation step") can be separated from the lower-temperature stage ("growth step") by quenching the reaction solution with any combination of the above solvents. Alternatively, quenching can be accomplished by any other suitable means, including but not limited to quenching with a liquid that is immiscible in the solvent, or by contact with a cooling coil, heat sink, or other heat exchanger. Any method that decreases the temperature of the solution abruptly, preferably in seconds, without chemically interacting with the reactants will work. It is preferred that the selected quenching mechanism produce as few inhomogeneities in the local precursor concentrations and in local temperature as possible. Ideally, the reactor is as well-mixed as possible.

Metal nanoparticles can be synthesized using these new solvents and/or quenching methods. In this embodiment, the metal chalcogenide precursors are replaced with metal precursors and a reducing agent. Likewise, metal oxide nanoparticles can be synthesized using these new solvents and/or quenching methods by replacing the metal chalcogenide precursors with metal precursors.

Other metal chalcogenide nanoparticles besides CdS, CdSe, and CdTe synthesized using these new solvents and/or quenching methods. Examples include: PbSe, PbTe, ZnS, ZnSe→II/VI compositions; GaAs, InSb→III/V compositions. Also, "core/shell" nanoparticles and related materials may of course by synthesized using the present techniques. These nanoparticles have a variable coating of another composition, e.g., CdSe nanoparticles with a surrounding shell of CdS are CdSe/CdS core/shell quantum dots. The present techniques can also be used to produce multiple layers.

While the preferred embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Accordingly, the scope of protection is not limited by the description set out above, but is only limited by the claims which follow, that scope including all equivalents of the subject matter of the claims.

The examples provided in the disclosure are presented for illustration and explanation purposes only and are not intended to limit the claims or embodiment of this invention. While the preferred embodiments of the invention have been shown and described, modification thereof can be made by one skilled in the art without departing from the spirit and teachings of the invention. Process criteria, equipment, and the like for any given implementation of the invention will be readily ascertainable to one of skill in the art based upon the disclosure herein. The embodiments described herein are exemplary only, and are not intended to be limiting. Many variations and modifications of the invention disclosed herein are possible and are within the scope of the invention. Use of the term "optionally" with respect to any element of the invention is intended to mean that the subject element is required, or alternatively, is not required. Both alternatives are intended to be within the scope of the invention.

The discussion of a reference in the Description of the Related Art is not an admission that it is prior art to the present invention, especially any reference that may have a publication date after the priority date of this application. The disclosures of all patents, patent applications, and publications cited herein are hereby incorporated herein by reference in their entirety, to the extent that they provide exemplary, procedural, or other details supplementary to those set forth herein.

We claim:

1. A method comprising:
   forming a solution-A comprising precursor (A) and a first solvent;
   forming a mixture-B comprising precursor (B) and a second solvent;
   forming a hot solution-B by heating mixture-B to a predetermined temperature greater than the temperature of solution-A;
   forming a synthesis mixture by injecting solution-A into hot solution-B;
   forming semiconductor nanocrystals in the synthesis mixture;
   quenching the synthesis mixture.

2. The method of claim 1 wherein the synthesis mixture is quenched by adding a relatively cool volume of a quench solvent.

3. The method of claim 2 wherein the quench solvent is the second solvent.

4. The method of claim 2 wherein the quench solvent is selected from the group consisting of heat transfer fluids, alkylated aromatics, aryl ethers, isomers of alkylated aromatics, alkyl benzenes, biphenyl (BP), phenyl ether (PE), terphenyls, and combinations thereof.

5. The method of claim 4 wherein precursor (A) is selected from the group consisting of Se, trioctylphosphine selenide (TOPSe), Te, S, As, Sb, and combinations thereof.

6. The method of claim 4 wherein precursor (B) is selected from the group consisting of oxides and other salts of Cd, Pb, Zn, Ga, In, and combinations thereof.

7. The method of claim 5 wherein precursor (A) is selected from the group consisting of Se, trioctylphosphine selenide (TOPSe), and combinations thereof, and the first solvent comprises trioctylphosphine (TOP).

8. The method of claim 7 wherein precursor (B) is selected from the group consisting of cadmium oxide, other cadmium salts, and combinations thereof.

9. The method of claim 8 wherein mixture-B further comprises oleic acid (OA).

10. The method of claim 5 wherein the second solvent is selected from the group consisting of biphenyl (BP), phenyl ether (PE), triphenyls, and combinations thereof.

11. The method of claim 10 wherein the second solvent is selected from the group consisting of biphenyl (BP), phenyl ether (PE), and combinations thereof.

12. The method of claim 11 wherein the second solvent is a combination of biphenyl (BP) and phenyl ether (PE).

13. The method of claim 4 further comprising:
    injecting additional precursor (A) into the quenched synthesis mixture.

14. The method of claim 4 further comprising:
    injecting additional precursor (B) into the quenched synthesis mixture.

15. The method of claim 13 further comprising:
    injecting additional precursor (B) into the quenched synthesis mixture.

16. The method of claim 4 further comprising:
    reheating the quenched synthesis mixture.

17. A method comprising:
    forming a solution-A/B comprising precursor (A) and precursor (B);
    forming a synthesis mixture by injecting solution-A/B into a hot solvent;
    forming semiconductor nanocrystals in the synthesis mixture;
    quenching the synthesis mixture by adding a relatively cool volume of the solvent.

18. The method of claim 17 wherein the solvent is selected from the group consisting of heat transfer fluids, alkylated aromatics, aryl ethers, isomers of alkylated aromatics, alkyl benzenes, biphenyl (BP), phenyl ether (PE), terphenyls, and combinations thereof.

19. The method of claim 18 wherein precursor (A) is selected from the group consisting of Se, trioctylphosphine sclenide (TOPSe), and combinations thereof, and precursor (B) is selected from the group consisting of cadmium oxide, other cadmium salts, and combinations thereof.

20. The method of claim 19 wherein solution-A/B further comprises oleic acid (OA).

21. The method of claim 19 further comprising reheating the quenched synthesis mixture.

22. The method of claim 19 wherein the solvent is selected from the group consisting of biphenyl (BP), phenyl ether (PE), triphenyls, and combinations thereof.

23. The method of claim 19 wherein the solvent is selected from the group consisting of biphenyl (BP), phenyl ether (PE), and combinations thereof.

24. A method for making semiconductor nanocrystals, comprising:
   a) dissolving a precursor of a desired element in a first solvent to form a precursor solution;
   b) mixing a metal oxide with a second solvent to form mixture;
   c) heating the mixture to a predetermined temperature; and
   d) injecting the precursor solution into the heated mixture to form a growth solution.

25. The method according to claim 24 wherein the second solvent, comprises phenyl ether or biphenyl.

26. The method according to claim 25 wherein the second solvent further comprises oleic acid (OA).

27. The method according to claim 24 wherein the second solvent is at room temperature.

28. The method according to claim 24 wherein the precursor solution comprises a molar ratio of the desired element to the first solvent of 1/300.

29. The method according to claim 24 wherein the precursor solution comprises a molar ratio of the desired element to oleic acid in the range of from 1/10 to 1/1, inclusive.

30. The method according to claim 29 wherein the precursor solution comprises a molar ratio of the desired element to oleic acid of 1/3.

31. The method according to claim 24 wherein step c) comprises heating the solution to at least 250° C. under vigorous stirring for 30 minutes or until the solution clears.

32. The method according to claim 24 wherein the precursor solution is injected into the heated mixture in less than 2 seconds.

33. The method according to claim 24 wherein the precursor solution is injected into the heated mixture in less than 1 second.

34. The method according to claim 24 wherein the injection temperature is between about 220 and 260° C.

35. The method according to claim 24 wherein the precursor is Cd.

36. The method according to claim 24 wherein step a) comprises dissolving selenium powder in trioctylphosphine (TOP) (Se/TOP =1/8 molar ratio).

37. The method according to claim 24, further comprising the step of
   e) quenching the growth solution.

38. The method according to claim 37 wherein step e) comprises cooling the growth solution to less than 200° C.

39. The method according to claim 37 wherein step e) comprises cooling the growth solution to less than 150° C.

40. The method according to claim 37 wherein step e) comprises cooling the growth solution to less than 120° C.

41. The method according to claim 37, further comprising the step of
   f) re-heating the quenched growth solution.

42. The method according to claim 41 wherein step e) comprises re-heating the growth solution to at least 120° C.

43. The method according to claim 41 wherein step e) comprises re-heating the growth solution to at least 150° C.

44. The method according to claim 24 wherein the second solvent is selected from the group, consisting of heat transfer fluids, alkylated aromatics, aryl ethers, isomers of alkylated aromatics, and alkyl benzenes.

45. The method according 24 wherein the second solvent is selected from the group consisting of inorganic solvents, silicone oil, related siloxane compounds having a molecular backbone of Si—O—Si bonds, and fluorinated solvents.

46. The method according to claim 24 wherein the second solvent comprises a phenylated compound.

* * * * *

UNITED STATES PATENT AND TRADEMARK OFFICE
CERTIFICATE OF CORRECTION

PATENT NO. : 7,998,271 B2
APPLICATION NO. : 10/595817
DATED : August 16, 2011
INVENTOR(S) : Ammar Alkhawaldeh et al.

It is certified that error appears in the above-identified patent and that said Letters Patent is hereby corrected as shown below:

Column 12, line 34, claim 44, delete "," after group.

Column 12, line 37, claim 45, between "The method according" and "24", add "to claim".

Signed and Sealed this
Fifteenth Day of November, 2011

David J. Kappos
*Director of the United States Patent and Trademark Office*